(12) United States Patent
Rieutord

(10) Patent No.: US 9,576,843 B2
(45) Date of Patent: Feb. 21, 2017

(54) PROCESS FOR BONDING IN AN ATMOSPHERE OF A GAS HAVING A NEGATIVE JOULE-THOMSON COEFFICIENT

(71) Applicant: COMMISSARIAT A L'ENERGIE ATOMIQUE ET AUX ENERGIES ALTERNATIVES, Paris (FR)

(72) Inventor: Francois Rieutord, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/397,390

(22) PCT Filed: Apr. 24, 2013

(86) PCT No.: PCT/IB2013/053229
§ 371 (c)(1),
(2) Date: Oct. 27, 2014

(87) PCT Pub. No.: WO2013/160841
PCT Pub. Date: Oct. 31, 2013

(65) Prior Publication Data
US 2015/0079759 A1 Mar. 19, 2015

(30) Foreign Application Priority Data
Apr. 27, 2012 (FR) ...................... 12 53921

(51) Int. Cl.
H01L 21/762 (2006.01)
H01L 25/065 (2006.01)
H01L 23/00 (2006.01)
H01L 21/18 (2006.01)
H01L 21/20 (2006.01)
H01L 21/302 (2006.01)

(52) U.S. Cl.
CPC ....... H01L 21/76251 (2013.01); H01L 21/187 (2013.01); H01L 21/2007 (2013.01); H01L 21/76254 (2013.01); H01L 24/80 (2013.01); H01L 25/0657 (2013.01); H01L 21/302 (2013.01)

(58) Field of Classification Search
CPC ............... H01L 21/302; H01L 25/0657; H01L 21/762251; H01L 24/80; H01L 21/187; H01L 21/76251;H01L 21/2007; H01L 21/76254

See application file for complete search history.

(56) References Cited

U.S. PATENT DOCUMENTS

| | | | |
|---|---|---|---|
| 7,192,844 B2* | 3/2007 | Couillard | H01L 21/76254 257/E21.48 |
| 8,530,331 B2* | 9/2013 | Beneyton | C09J 5/06 257/E21.122 |
| 2003/0082886 A1* | 5/2003 | De Los Santos | H01L 21/2007 438/404 |
| 2007/0155056 A1* | 7/2007 | Kang | H01L 21/2007 438/118 |
| 2007/0207593 A1* | 9/2007 | Couillard | H01L 21/76254 438/455 |
| 2008/0014712 A1* | 1/2008 | Bourdelle | H01L 21/187 438/455 |
| 2011/0104871 A1 | 5/2011 | Tobisaka et al. | |
| 2013/0307165 A1* | 11/2013 | Wang | H01L 21/76251 257/782 |

FOREIGN PATENT DOCUMENTS

| | | |
|---|---|---|
| EP | 1 566 830 | 11/2003 |
| EP | 2 200 077 | 12/2008 |
| EP | 2 442 353 | 10/2011 |
| JP | H05-217973 | 8/1993 |
| JP | 2007 194343 | 2/2007 |
| JP | 2007194343 A * | 8/2007 |

OTHER PUBLICATIONS

Rieutord et al. "Dynamics of a bonding front," Physical Review Letters, vol. 94, pp. 236101, 2005.

* cited by examiner

*Primary Examiner* — Alonzo Chambliss
(74) *Attorney, Agent, or Firm* — Norton Rose Fulbright US LLP

(57) ABSTRACT

The present invention relates to a process for direct bonding two substrates, comprising at least: (a) bringing the surfaces to be bonded of said substrates in close contact; and (b) propagating a bonding wave between said substrates, characterised in that said substrates are kept, during step (b), in an atmosphere of a gas having a negative Joule-Thomson coefficient at the temperature and pressure of said atmosphere.

17 Claims, 2 Drawing Sheets

Figure 1:
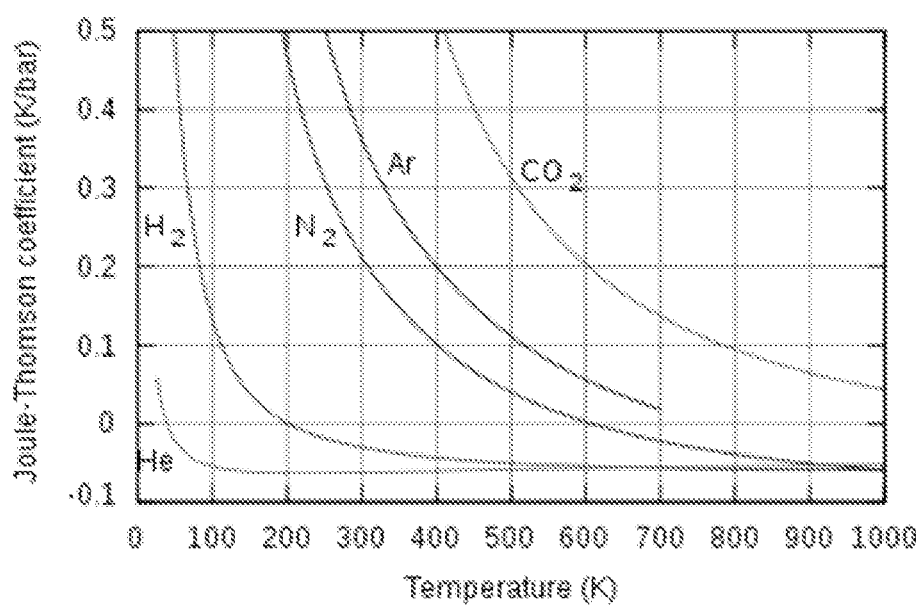

PROCESS FOR BONDING IN AN ATMOSPHERE OF A GAS HAVING A NEGATIVE JOULE-THOMSON COEFFICIENT

CROSS-REFERENCE TO RELATED APPLICATIONS

This application is a national phase application under 35 U.S.C. § 371 of International Application No. PCT/IB2013/053229 filed 24 Apr. 2013, which claims priority to French Patent Application No. 1253921 filed 27 Apr. 2012. The entire contents of each of the above-referenced disclosures is specifically incorporated herein by reference without disclaimer.

The present invention relates to the field of direct bonding. It has more particularly as subject-matter a novel process for bonding two substrates by molecular adhesion.

The direct bonding (wafer bonding) of materials, also incorrectly known as "molecular bonding", is a well known technique for producing assemblages of materials, in particular in the field of microelectronics. Direct bonding occurs in particular in techniques for producing multilayer semiconductor structures (also known as "composite structures" or "multilayer semiconductor wafers"), such as, for example, in techniques of Smart Cut® type, which employ the transfer of a thin layer of a donor substrate onto a receiving substrate, the said thin layer being rendered integral with the receiving substrate by molecular adhesion.

Generally, direct bonding is initiated by local application of a light mechanical pressure to the substrates brought into contact. The object of this pressure is to bring the two materials to a sufficiently short distance so that the forces of attraction (Van der Waals force, hydrogen bonds, indeed even covalent bonds) may be established between atoms or molecules of the two surfaces to be bonded. A bonding front is then propagated from the point of initiation over the entire extent of the surfaces, with the effect of intimately bonding the two substrates. The application of a pressure point is not, however, obligatory. The simple fact of bringing two sufficiently flat surfaces into contact may be sufficient to spontaneously initiate, after a more or less lengthy time, the propagation of the bonding front.

The study of this bonding front and the parameters which determine its speed is set out in particular in the publication Rieutord et al., Dynamics of a bonding front, Physical Review Letters, vol. 94, pp. 236101, 2005. It is mentioned therein that the advance of the front is the result of two antagonistic effects: on the one hand, the adhesion energy of the plates, which tends to propagate the bonded region, and, on the other hand, the viscous resistance of the gas trapped between the plates, which tends to slow down this extension.

In order to make use of the multilayer structures formed by direct bonding, in particular in the field of microelectronics, it is essential to obtain a bonding interface exhibiting excellent quality and excellent homogeneity. This is because the bonding of two plates of materials by molecular adhesion is generally followed by one or more stages of thinning one of the bonded plates, for example by mechanical/chemical polishing, chemical attack or splitting, to leave only a thin film (typically from a few micrometres to several tens of nanometres), with a result that the exposed surface of the final thin film will be found very close to the bonding interface.

Consequently, if some regions are poorly bonded, the final layer may be torn off during the various technological stages which follow the bonding (thinning, annealing, production of component, and the like).

Unfortunately, bonding by molecular adhesion generally results in the appearance of defects, in particular of "bubbles" type and of "edge voids" type along the edge of the bonded substrates. The term "bubbles" is understood to mean defects which result from the trapping of gas and/or of water at the bonding interface between the two substrates. The term "edge voids" is understood to mean defects which result from the bonding and which are typically observed at the periphery of the final structure (generally in the form of a circular platelet). These defects are generally observed on the opposite side from the initiation point over a sector which may be relatively broad (typically 120°) and, in the case where the initiation is carried out in the centre of the plates, over the whole of the periphery of the plates.

The presence of such particles or bubbles trapped at the bonding interface, acting as spacers between the bonded surfaces, is capable of affecting the quality of the bonding of the two substrates and thus proves to be particularly harmful for the targeted applications of the structures bonded by molecular adhesion.

What is more, in the context of the use of thin layer transfer techniques of Smart Cut® type, it has been observed that the appearance of edge void defects is accentuated in the case where a recycled donor substrate is bonded (that is to say, a donor substrate which has already been used for the removal and transfer of a thin layer, known as "refresh" platelet), in comparison with when an original donor substrate is bonded (which has never been used for the withdrawal and transfer of a thin layer, known as "fresh" platelet). The increased presence of defects thus forms an obstacle to the use of recycled plates in thin layer transfer techniques.

Various routes have been explored in attempting to reduce the number or the size of these defects.

For example, the speed of the bonding front has been identified as being a factor influencing the number of defects, with a beneficial effect of the reduction in this speed on the number of defects. To this end, various techniques for controlling this speed have been proposed, in particular via a treatment of the surface state of one and/or other of the said substrates, in particular by heating (WO 2007060145). It has also been proposed, for the purpose of reducing the speed of the bonding front, to project, at the time of the bonding, a gas jet, optionally a hot gas jet, in the direction of the initiation point of the bonding front (EP 2 963 157). However, these treatments, while they may indeed bring about a reduction in the bonding speed, are also capable of reducing the adhesion energy, which may be harmful to certain applications. The relationship between the speed of the bonding front and adhesion energy is, for example, described by Rieutord et al. (Dynamics of a bonding front, Physical Review Letters, vol. 94, pp. 236101, 2005).

In addition, the document EP 2 200 077 proposes to carry out the operation in which the substrates are brought into intimate contact under partial vacuum, for the purpose of reducing the number of defects without significantly affecting the adhesion energy. However, this method of bonding under partial vacuum makes it difficult to use conventional equipment for the bonding by molecular adhesion for fixing and aligning the substrates.

Finally, mention may also be made of the document EP 1 566 830 which proposes to modify the configuration of the edges of plates during the manufacture thereof, in particular to modify the curvature of the edge falls. However, this solution exhibits the disadvantage of requiring a preliminary mechanical operation on the plates to be bonded.

The present invention is targeted at providing a novel means for reducing the number of defects caused during direct bonding, indeed even to completely avoid the formation of such defects.

More specifically, the inventors have discovered that it is possible to reduce these defects, indeed even to eliminate them completely, by carrying out the bonding of the substrates by molecular adhesion in a specific gas atmosphere exhibiting, at the temperature and at the pressure of the said atmosphere, a negative Joule-Thomson coefficient.

Thus, the present invention relates, according to a first of its aspects, to a process for bonding two substrates by molecular adhesion, comprising at least:

(a) bringing the surfaces to be bonded of the said substrates into intimate contact;

(b) propagating a bonding front between the said substrates;

characterized in that the said substrates are kept, during stage (b), in a gas atmosphere exhibiting, at the temperature and at the pressure of the said atmosphere, a negative Joule-Thomson coefficient.

Of course, it is up to a person skilled in the art to employ the two juxtaposed substrates of stage (a) under conditions favourable to the propagation of the bonding front.

It may, for example, be a matter of keeping the two surfaces to be bonded in contact for a period of time which is sufficiently long to spontaneously initiate the bonding process.

According to a particularly advantageous variant embodiment, the propagation of the bonding front in stage (b) may be initiated by the application of at least one pressure point on at least one of the external faces of the assembly formed by the two juxtaposed substrates. The application of a contact force advantageously makes it possible to rapidly trigger the process of bonding between the two substrates.

The process of the invention may more particularly be carried out in a closed chamber containing the gas atmosphere required according to the invention.

According to a specific embodiment, stages (a) and (b) are both carried out in a gas atmosphere in accordance with the invention, in particular using a conventional direct bonding device introduced into a chamber containing the said gas atmosphere.

The term "bringing into intimate contact" is understood to mean that the surfaces to be bonded are brought to a sufficiently short distance to enable bonding to be initiated, typically to a distance of less than a few nanometres.

The term "pressure point", also known as "contact point", is intended to denote the local application of a contact force on the exposed surface of at least one of the substrates placed side by side, for example using an application tool ("bond pin"). As specified above, the pressure point is such that it generates a bonding front which will be propagated from the pressure point. This propagation will, for example, be concentric in the case where the pressure point is exerted in the central region of the two juxtaposed surfaces.

The term "bonding front" is intended to denote the bonding or molecular adhesion front which propagates from a point of initiation of the bonding and which corresponds to the diffusion of the attractive forces (Van der Waals forces, for example) from this initiation point over the entire extent of the surface of intimate contact between the two substrates.

Unless otherwise mentioned, reference is made, in the continuation of the text, to "surfaces to be bonded", also known as "first bonding surface" and "second bonding surface", to denote each of the surfaces of the two substrates brought into contact with one another for the bonding.

The process of the invention proves to be advantageous on several accounts.

First of all, as illustrated in the following example, the use of a gas atmosphere according to the invention during the bonding by molecular adhesion makes it possible to eliminate the appearance of edge void defects or of bubbles along the edge of the bonded substrates.

Furthermore, the use of such a gas atmosphere does not affect the effectiveness of the bonding, in particular does not impact the adhesion energy. This is particularly advantageous in the case of the assembling of plates on which circuits are already implemented and which may not be subjected to a subsequent high temperature annealing for the purpose of increasing, after bonding, the adhesion energy.

In addition, the process of the invention, requiring only an adaptation of the atmosphere during the bonding, does not impact the stages of preparation of the samples, which thus makes it possible to optimize, separately and without interaction, the surface treatment processes in order to make it possible, for example, to increase the adhesion energy required by the targeted application.

Finally, the process of the invention proves to be particularly easy to carry out, insofar as use may be made of the items of equipment conventionally employed for bonding substrates by molecular adhesion. In particular, the bonding according to the invention can be carried out in an atmosphere at atmospheric pressure and at ambient temperature, which allows the use of systems for the fixing of the substrates based on a negative pressure under the support, and make it possible to keep operational many alignment and control systems generally employed in bonding machines.

As enlarged upon subsequently, the bonding process of the invention may be carried out in the context of the production of various structures where the direct bonding of surfaces is desired, in particular in techniques for the formation of structures comprising a thin layer made of a semiconductor material on a receiving substrate, such as the Smart Cut® technique, which will be described in detail in the continuation of the text.

Thus, according to another of its aspects, the present invention relates to a process for the formation of a structure comprising a thin layer (13) made of a semiconductor material, in particular made of silicon, on a substrate, comprising at least the stages consisting in:

(c) having available a donor substrate (A) comprising a part to be transferred comprising at least one thin layer (13) of the said semiconductor material and exhibiting a first bonding surface (15), and having available a receiving substrate (B) exhibiting a second bonding surface (15');

(d) bonding, by molecular adhesion, the said first surface (15) and the said second surface (15'); and (e) removing the remainder of the donor substrate (A) from the said part bonded to the said receiving substrate (B), characterized in that stage (d) is carried out according to a bonding process as defined above.

Other characteristics, alternative forms and applications of the process according to the invention will emerge more clearly on reading the description, examples and figures which will follow, given by way of illustration and without implied limitation.

Unless otherwise indicated, the expression "comprising a" should be understood as "comprising at least one".

Gas Atmosphere

As mentioned above, the bonding of the substrates according to the invention is carried out in a gas atmosphere exhibiting, at the temperature and at the pressure of the said atmosphere, a negative Joule-Thomson coefficient, in particular of less than or equal to −0.01 K/bar, in particular of less than or equal to −0.05 K/bar.

The Joule-Thomson coefficient describes, for a given gas or gas mixture, the variation in temperature associated with a change in pressure $\mu_{JT}=\Delta T/\Delta P$ when the volume of the gas or gas mixture increases (the gas undergoes a reduction in pressure).

FIG. 1 presents, as an example, the curves of variation in the Joule-Thomson coefficient as a function of the temperature for different gases at atmospheric pressure. It may, for example, be observed, on this graph, that, at ambient temperature and atmospheric pressure, helium and hydrogen exhibit a negative Joule-Thomson coefficient, which means that, at ambient temperature and atmospheric pressure, these gases will heat up during a reduction in pressure.

The term "gas atmosphere" is understood to mean that the said atmosphere is formed of a gas or gas mixture.

The composition of an atmosphere in accordance with the invention is such that, under the given conditions of temperature and pressure, the said atmosphere exhibits a negative Joule-Thomson coefficient. A person skilled in the art is in a position to choose the nature of the said gas or gases and to adjust the operating temperature and pressure in order to form an atmosphere in accordance with the invention.

More particularly, the atmosphere according to the invention comprises one or more gases exhibiting, at the given temperature and pressure, a negative Joule-Thomson coefficient.

According to a particularly preferred embodiment, the bonding is carried out at ambient temperature and atmospheric pressure.

The term "ambient temperature" is understood to mean a temperature of approximately 25° C. The term "atmospheric pressure" is understood to mean a pressure of approximately 1013 hPa.

In the context of this embodiment, the said atmosphere may comprise one or more gases chosen from helium, neon and hydrogen.

According to a first alternative embodiment, the said atmosphere may be formed of one or more gases which exhibit(s), at the temperature and at the pressure of the said atmosphere, a negative Joule-Thomson coefficient. In other words, the said atmosphere does not comprise a gas exhibiting, at the said given temperature and the said given pressure, a positive Joule-Thomson coefficient.

For example, in the case of carrying out the bonding at ambient temperature and atmospheric pressure, the said atmosphere may be formed of a gas or gas mixture chosen from helium, neon and hydrogen.

According to a specific embodiment, the said atmosphere is composed of helium.

According to another alternative embodiment, the said atmosphere may be formed of a mixture (i) of one or more gases exhibiting, at the temperature and pressure of the said atmosphere, a negative Joule-Thomson coefficient and (ii) of one or more gases exhibiting, at the temperature and pressure of the said atmosphere, a positive Joule-Thomson coefficient.

Of course, it is up to the skills of a person skilled in the art to adjust the respective amounts of the different gases so that the final mixture exhibits, at the temperature and at the pressure of the said atmosphere, a negative Joule-Thomson coefficient.

For example, in the case of carrying out the bonding at ambient temperature and atmospheric pressure, the said atmosphere may be formed of a mixture (i) of one or more gases chosen from helium, neon and hydrogen and (ii) of one or more gases exhibiting, at ambient temperature and atmospheric pressure, a positive Joule-Thomson coefficient, chosen in particular from nitrogen, oxygen and argon, in proportions such that the said mixture exhibits, at ambient temperature and atmospheric pressure, a negative Joule-Thomson coefficient.

In particular, the said atmosphere may be formed of a mixture (i) of one or more gases chosen from helium, neon and hydrogen with (ii) air, in proportions such that the said mixture exhibits, at ambient temperature and atmospheric pressure, a negative Joule-Thomson coefficient.

According to a specific embodiment, the said atmosphere is formed of a mixture of helium and air in proportions such that the said mixture exhibits a negative Joule-Thomson coefficient.

Bonding Process

The bonding process according to the invention comprises the stages conventionally employed for bonding by molecular adhesion. More particularly, the surfaces of the substrates to be bonded are first of all brought into intimate contact and then the bonding is carried out by propagation of a bonding front between the said substrates.

Substrates

The process of the invention can be applied to the assembling of any type of material compatible with bonding by molecular adhesion and in particular of insulating materials, such as, for example, quartz and glass, and semiconductor materials, such as, for example, silicon, germanium, and the like.

Direct bonding occurs in particular in the context of the preparation of structures of "Semiconductor On Insulator" type, also known as SeOI structures, and in particular for the preparation of structures of "Silicon On Insulator" type, also known as SOI structures.

In the context of the last application, at least one of the substrates to be bonded exhibits a layer of oxide at the surface. By way of examples, the formation of an SOI structure may comprise an $Si/SiO_2$ or also $SiO_2/SiO_2$ bonding.

The substrates to be assembled may be of various shapes, provided that they each exhibit a flat surface appropriate for bringing them into intimate contact.

The substrates may more particularly be in the form of wafers with a generally circular outline and may exhibit different diameters, for example a diameter ranging from 100 nm to 300 nm.

Preparation of the Surfaces

The surfaces of the said substrates to be bonded may be subjected, prior to them being brought into intimate contact, to one or more surface treatment stages intended in particular to promote molecular adhesion, such as, for example, a polishing, cleaning, hydrophilic/hydrophobic treatment, and the like.

These treatments may be carried out on one of the two surfaces to be bonded, indeed even on both surfaces to be bonded.

This is because, in order to promote molecular adhesion, the surfaces to be bonded have to be sufficiently smooth and devoid of particles or contamination.

Mention may in particular be made, as examples of chemical treatments, of:

- cleaning of RCA type, namely the combination of the $SC_1$ bath ($NH_4OH$, $H_2O_2$, $H_2O$), suitable for the withdrawal of particles and hydrocarbons, and of an $SC_2$ bath (HCl, $H_2O_2$, $H_2O$), suitable for the withdrawal of metal contaminants;
- cleaning with an ozone ($O_3$) solution, suitable for the withdrawal of organic contaminants; or also
- cleaning with a solution comprising a mixture of sulphuric acid and hydrogen peroxide (also known as SPM (sulphuric peroxide mixture) solution).

The preparation of the surfaces to be bonded may also comprise a mechanical preparation of the surfaces (gentle polishing, brushing), in or not in addition to the chemical treatments. These treatments are more particularly intended to provide the surfaces with a flatness suitable for the bonding. Preferably, the surface roughness, measured, for example, by atom force microscopy (that is to say, with lateral scales with a wavelength of 10 nm to 1 μm), does not exceed, preferably, 0.5 nm rms in order for bonding to take place.

A person skilled in the art is in a position to employ the appropriate methods for the preparation of the surfaces conventionally employed in techniques of bonding by molecular adhesion.

The process of the invention may also be combined with other known means proposed for reducing the appearance of defects, such as, for example, a modification of the surface state, of the flexibility of the substrates, of the curvature of the edges of the substrates, and the like.

Bonding Stage (b)

Stage (b) of propagation of the bonding front according to the process of the invention is carried out in a specific gas atmosphere as defined above.

As mentioned above, the propagation of the bonding front may advantageously be initiated by application of at least one pressure point on at least the exposed surface of at least one of the two substrates placed side by side.

This pressure point may be applied on the peripheral edge or at the centre of the said substrate, in particular on the peripheral edge. The contact point is typically initiated by application of a mechanical pressure to the exposed surface of one of the two substrates using an application tool ("bond pin"). The application of this contact force makes it possible to initiate the propagation of a bonding front starting from this initiation point. The propagation of the bonding front over the whole of the bonding surfaces of the substrates thus makes it possible to bond the two substrates by molecular adhesion.

The strength of the contact force applied generally corresponds to a mechanical pressure of less than 2 MPa.

As mentioned above, the bonding process according to the invention, in particular carried out at atmospheric pressure and ambient temperature, has the advantage of being compatible with the devices currently used for bonding by molecular adhesion.

The process of the invention may thus be carried out using any bonding device conventionally used for bonding two substrates by molecular adhesion. Such devices generally comprise a substrate holder and a tool for application of a pressure point for initiating the bonding front between the two substrates, for example a Teflon® stylus.

The conventional bonding device may be introduced into a chamber containing a gas atmosphere in accordance with the invention, for the purpose of carrying out the bonding process according to the invention.

Applications

According to a specific embodiment, the bonding process according to the invention may thus be employed in a process for the formation of a thin layer structure made of a semiconductor material on a receiving substrate, such as, for example, of an SeOI structure and more particularly of an SOI structure.

In the context of the preparation of such a structure, the bonding process is then carried out between a substrate referred to as "donor substrate", comprising a part to be transferred comprising at least one thin layer made of a semiconductor material and exhibiting a first bonding surface, and a substrate referred to as "receiving substrate", exhibiting a second bonding surface.

Thus, the present invention also relates to a process for the formation of a structure comprising a thin layer made of a semiconductor material on a substrate, comprising at least the stages consisting in:

(c) having available a donor substrate comprising a part to be transferred comprising at least one thin layer of the said semiconductor material and exhibiting a first bonding surface, and having available a receiving substrate exhibiting the second bonding surface;

(d) bonding, by molecular adhesion, the said first surface and the said second surface; and (e) removing the remainder of the donor substrate from the said part bonded to the said receiving substrate, characterized in that stage (d) of bonding by molecular adhesion is carried out in a gas atmosphere in accordance with the invention as described above.

The said thin layer of the said semiconductor material may comprise at least one material chosen from Si, SiC, SiGe, Ge, a III-V compound (composite semiconductors manufactured from an element of Group III of the Periodic Table of the Elements and from an element of Group V), a II-VI compound and their mixtures. The receiving substrate may comprise a layer of material or several layers of one or more materials exhibiting the second bonding surface. The receiving support may comprise a material chosen from silicon, sapphire, glass and quartz.

The part to be transferred may also comprise, in addition to the thin layer to be transferred, another layer of material exhibiting the said first bonding surface. This other layer may in particular comprise at least one material chosen from $SiO_2$, $Si_3N_4$, diamond, $Al_2O_3$ or AlN. It may in particular be a layer of $SiO_2$.

As implementational example, the bonding process according to the invention may be employed in a technique of Smart Cut® type developed by Soitec, in order to obtain a stacked structure of SOI type. This technique is more particularly described below with reference to FIG. 2.

It consists in delimiting a thin layer made of a semiconductor material with an optional insulator in a starting substrate (donor substrate) by ion implantation through a face of this substrate, in order to obtain a layer modified to a predetermined depth, and then rendering the implanted face integral with a face of a receiving support by direct bonding and, finally, in separating the thin layer from the remainder of the starting substrate.

Figure 2A:
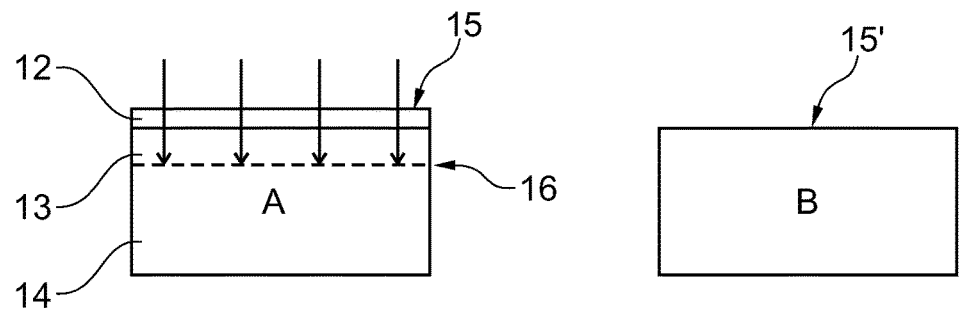

More particularly, FIG. 2a shows a starting substrate (A), for example made of silicon, if appropriate covered with a layer (12) of silicon oxide exhibiting a surface (15). This figure shows the substrate during a stage of ion implantation (represented by arrows) intended to delimit a thin layer (13) in the substrate. The gaseous entities implanted through the surface (15) produce, after heat treatment, at a depth determined by the implantation energy, a layer of microcavities (16). The gaseous entities may preferably be chosen from hydrogen, helium or a combination of these entities. The thin layer (13) thus delimited in the starting substrate will subsequently be transferred onto a receiving support (B), for example made of silicon.

Figure 2B:
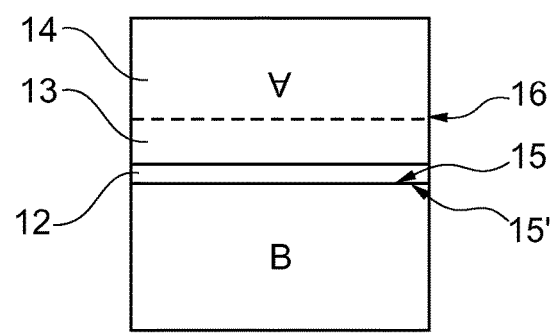

FIG. 2b shows the structure obtained after bonding according to the invention, by molecular adhesion, the surface (15) of the substrate (A) and one of the surfaces (15') of a receiving substrate (B).

Figure 2C:
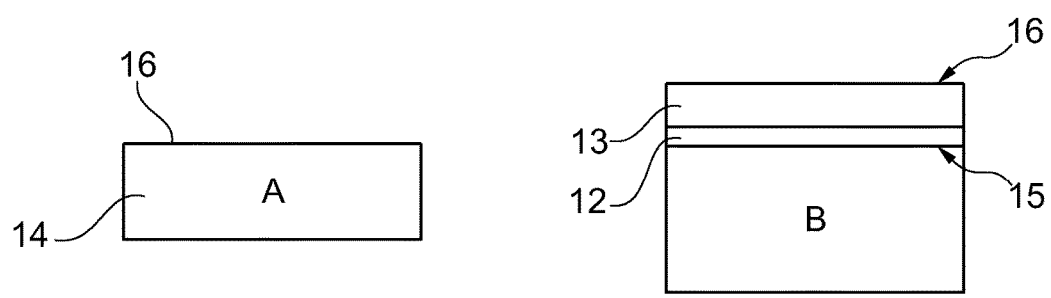

During a subsequent stage, the thin layer (13) is separated from the remainder of the starting substrate by splitting at the layer (16). Fracturing is, for example, obtained by means of a heat treatment which additionally makes it possible to strengthen the direct bonding. The stacked structure represented in FIG. 2c is obtained.

This structure comprises a thin layer of silicon (13) supported by the receiving support (B) and insulated from this support by an insulating layer consisting of the oxidized layer (12).

FIGURES

FIG. 1: graphical representation of the variation in the Joule-Thomson coefficient as a function of the temperature for different gases at atmospheric pressure.

FIG. 2: transverse cross sections of the substrate or substrates at the different stages of the Smart Cut® process.

It should be noted that, for reasons of clarity, the different elements in FIG. 2 are not drawn to scale, the true dimensions of the different parts not being observed.

The following example is given by way of illustration and without implied limitation of the invention.

EXAMPLE

Bonding by Molecular Adhesion

The bonding by molecular adhesion was carried out between a first silicon wafer carrying a layer of silicon oxide defining a first bonding surface and a second silicon wafer defining a second bonding surface. The wafers are in the form of circular platelets with a diameter from 1 inch (2.54 cm) to 450 mm.

The surfaces to be bonded of the substrates were cleaned beforehand by brushing, then rinsing with ultra-pure water and drying by centrifuging.

The substrates were positioned on the substrate holders of a conventional bonding device (EV® 540 Automated Wafer Bonding System from EVG) capable of bringing the surfaces of the said substrates into intimate contact and of initiating the bonding front via the application of a bond pin at a point of the peripheral edge of the exposed surface of one of the substrates.

The bonding device is introduced into a chamber containing a gas atmosphere and in which the automated bonding is carried out by the bonding device.

The bonding process is repeated while varying the nature of the gas atmosphere of the bonding chamber, at ambient temperature and atmospheric pressure. The atmospheres tested are as follows:
1. air,
2. nitrogen,
3. argon, and
4. helium.

Results

Observation of the bonding interface, using an infrared camera or also by acoustic microscopy, reveals the presence along the edge of the plates of edge void or bubble defects in the case of the plates under an air, nitrogen or argon atmosphere.

On the other hand, in the case of the bonding carried out under a helium atmosphere, no edge void or bubble defect is observed at the periphery of the bonding interface.

The invention claimed is:

1. A process for bonding two substrates by molecular adhesion, comprising at least:
   (a) bringing the surfaces to be bonded of the said substrates into intimate contact; and
   (b) propagating a bonding front between the said substrates;
wherein the said substrates are kept, during stage (b), in a gas atmosphere exhibiting, at the temperature and at the pressure of the said atmosphere, a negative Joule-Thomson coefficient.

2. The process according to claim 1, in which the propagation of the bonding front is initiated by the application of at least one pressure point on at least one of the external faces of the assembly formed by the two juxtaposed substrates.

3. The process according to claim 2, in which the pressure point is applied on the peripheral edge of the exposed surface of at least one of the two juxtaposed substrates.

4. The process according to claim 1, in which the said atmosphere is formed of a gas or gas mixture, the said gas or gases exhibiting, at the temperature and pressure of the said atmosphere, a negative Joule-Thomson coefficient.

5. The process according to claim 1, in which the said atmosphere is formed of a mixture composed (i) of one or more gases exhibiting, at the temperature and at the pressure of the said atmosphere, a negative Joule-Thomson coefficient and (ii) of one or more gases exhibiting, at the temperature and at the pressure of the said atmosphere, a positive Joule-Thomson coefficient, in proportions such that the said mixture exhibits, at the temperature and at the pressure of the said atmosphere, a negative Joule-Thomson coefficient.

6. The process according to claim 1, in which stage (b) is carried out at ambient temperature and at atmospheric pressure.

7. The process according to claim 6, in which the said atmosphere is formed of one or more gases chosen from helium, neon and hydrogen.

8. The process according to claim 6, in which the said atmosphere is formed of a mixture (i) of one or more gases chosen from helium, neon and hydrogen and (ii) of one or more gases exhibiting, at ambient temperature and atmospheric pressure, a positive Joule-Thomson coefficient, in proportions such that the said mixture exhibits, at ambient temperature and atmospheric pressure, a negative Joule-Thomson coefficient.

9. The process according to claim 8, in which said gases exhibiting, at ambient temperature and atmospheric pressure, a positive Joule-Thomson coefficient, are chosen from nitrogen, oxygen and argon.

10. The process according to claim 8, in which the said atmosphere is formed of a mixture (i) of one or more gases chosen from helium, neon and hydrogen with (ii) air, in proportions such that the said mixture exhibits, at ambient temperature and atmospheric pressure, a negative Joule-Thomson coefficient.

11. The process according to claim 6, in which the said atmosphere comprises one or more gases chosen from helium, neon and hydrogen.

12. The process according to claim 1, in which one of the surfaces, indeed even both surfaces, to be bonded of the said substrates is/are subjected, prior to stage (a), to one or more surface treatment stages intended to promote molecular adhesion.

13. The process according to claim 12, in which the surface treatment(s) is/are chosen from a polishing, cleaning and/or hydrophilic or hydrophobic treatment.

14. A process for the formation of a structure comprising a thin layer made of a semiconductor material on a substrate, comprising at least the stages consisting in:
 (c) having available a donor substrate comprising a part to be transferred comprising at least one thin layer of the said semiconductor material and exhibiting a first bonding surface, and having available a receiving substrate exhibiting a second bonding surface;
 (d) bonding, by molecular adhesion, the said first surface and the said second surface; and
 (e) removing the remainder of the donor substrate from the said part bonded to the said receiving substrate;
 wherein the bonding stage (d) is carried out according to a process comprising at least:
  (a) bringing the surfaces to be bonded of the said substrates into intimate contact; and
  (b) propagating a bonding front between the said substrates;
  wherein the said substrates are kept, during stage (b), in a gas atmosphere exhibiting, at the temperature and at the pressure of the said atmosphere, a negative Joule-Thomson coefficient.

15. The process according to claim 14, in which the said semiconductor material is silicon.

16. The process according to claim 14, in which the part to be transferred comprises, in addition to the said thin layer, another layer of material, the said other layer of material exhibiting the said first bonding surface.

17. The process according to claim 16, in which the said another layer of material is of silicon oxide.

\* \* \* \* \*